(12) United States Patent
Dhong et al.

(10) Patent No.: US 6,744,282 B1
(45) Date of Patent: Jun. 1, 2004

(54) LATCHING DYNAMIC LOGIC STRUCTURE, AND INTEGRATED CIRCUIT INCLUDING SAME

(75) Inventors: Sang Hoo Dhong, Austin, TX (US); Joel Abraham Silberman, Somers, NY (US); Osamu Takahashi, Round Rock, TX (US); James Douglas Warnock, Somers, NY (US); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/401,327

(22) Filed: Mar. 27, 2003

(51) Int. Cl.[7] ............................................. H03K 19/00
(52) U.S. Cl. ........................................ 326/93; 326/121
(58) Field of Search ............................ 326/63, 93, 94, 326/95, 96, 97, 98, 101, 121

(56) References Cited

U.S. PATENT DOCUMENTS

| | | | | |
|---|---|---|---|---|
| 5,357,522 A | * | 10/1994 | Ha | 714/725 |
| 5,543,731 A | * | 8/1996 | Sigal et al. | 326/40 |
| 5,576,651 A | * | 11/1996 | Phillips | 327/202 |
| 6,023,179 A | * | 2/2000 | Klass | 327/211 |
| 6,225,827 B1 | * | 5/2001 | Fujii et al. | 326/98 |
| 6,275,071 B1 | * | 8/2001 | Ye et al. | 326/98 |
| 6,404,234 B1 | * | 6/2002 | Hsu et al. | 326/93 |
| 6,614,265 B2 | * | 9/2003 | Buettner et al. | 326/96 |

* cited by examiner

*Primary Examiner*—Michael Tokar
*Assistant Examiner*—Linh V. Nguyen
(74) *Attorney, Agent, or Firm*—Carr LLP; Robert M. Carwell (57) ABSTRACT

A latching dynamic logic structure is disclosed including a static logic interface, a dynamic logic gate, and a static latch. The static logic interface receives a data signal, a select signal, and a clock signal, and produces a first intermediate signal such that when the select signal is active, the first intermediate signal is dependent upon the data signal for a period of time following a clock signal transition. The dynamic logic gate discharges a dynamic node following the clock signal transition dependent upon the first intermediate signal. The static latch produces an output signal assuming one of two logic levels following the clock signal transition, and assuming the other logic level in the event the dynamic node is discharged. A scan-testing-enabled version of the latching dynamic logic structure is described, as is an integrated circuit including the latching dynamic logic structure.

20 Claims, 4 Drawing Sheets

LATCHING DYNAMIC LOGIC STRUCTURE, AND INTEGRATED CIRCUIT INCLUDING SAME

TECHNICAL FIELD

This invention relates generally to electronic circuits and, more particularly, to digital logic circuits including storage elements for storing data responsive to one or more synchronizing clock signals.

BACKGROUND OF THE INVENTION

Many complex digital logic circuits, including processors, employ a technique called "pipelining" to perform more operations per unit of time (i.e., to increase throughput). Pipelining involves dividing a process into sequential steps, and performing the steps sequentially in independent stages. For example, if a process can be performed via n sequential steps, a pipeline to perform the process may include n separate stages, each performing a different step of the process. Since all n stages can operate concurrently, the pipelined process can potentially operate at n times the rate of the non-pipelined process. When a number of operations to be performed is large, the sizeable delay between the time the first operation is started and the first operation is completed does not appreciably increase an average time required per operation.

Hardware pipelining involves partitioning a sequential process into stages, and adding storage elements (i.e., groups of latches or flip-flops, commonly called registers) between stages to hold intermediate results. When the number of operations to be performed is large and the cost of adding storage elements between stages is small compared to the cost of the stages themselves, pipelining is advantageous.

In general, two factors prevent a pipelined process from reaching the theoretical n-fold gain in operating rate: (i) A maximum rate at which each step of the operation can be performed will be determined by the slowest stage in the process, and (ii) a certain amount of time is required to transfer the results of one stage to the next.

In a typical hardware pipeline, combinational logic within each stage performs logic functions upon input signals received from a previous stage. The storage elements positioned between the combinational logic of each stage are responsive to one or more synchronizing clock signals.

Latches are relatively simple storage structures that, when enabled, transfer input signal values to outputs. A pipelined system may include latches positioned between the combinational logic of each stage, wherein the latches are responsive to a single clock signal. In this situation, an active time period (i.e., a "width") of the clock signal must be long enough (i.e., "wide" enough) to allow every signal to propagate through a single stage of the pipeline, yet short enough (i.e., "narrow" enough) to prevent any signal from propagating through more than one pipeline stage. Due to the difficulty in satisfying the above requirements under many varying operating conditions (e.g., temperature, power supply voltage, manufacturing, and aging), this "narrow pulse clocking" scheme has largely been abandoned in favor of more robust schemes.

More complex approaches such as latch-pair storage elements and associated two-phase clocking schemes more readily satisfy the above timing requirements. In general, a latch-pair storage element includes two series-connected latches, each responsive to a different one of two clock signals. The two clock signals are substantially complementary, often made non-overlapping, and constitute a two-phase clocking scheme. A first or "master" latch of a latch-pair storage element "captures" data at an input in response to one of the two clock signals, and the second or "slave" latch "launches" stored data at an output in response to the second clock signal.

In general, common complementary metal oxide semiconductor (CMOS) logic structures (e.g., gates, latches, registers, and the like) are either static or dynamic. Static logic structures generally include "static" nodes connected via one or more low resistance paths to one of two power supply voltage levels (e.g., to either $V_{DD}$ or $V_{SS}$) at all times during operation. The low resistance paths are typically formed through activated metal oxide semiconductor (MOS) devices (i.e., transistors).

Dynamic logic structures, on the other hand, generally include "dynamic" nodes having capacitances upon which electrical charges are stored. The dynamic nodes are typically charged to one voltage level (i.e., precharged) during a precharge operation, and selectively charged (e.g., discharged) to another voltage level during a subsequent evaluation operation dependent upon one or more input signals. For example, dynamic nodes of dynamic logic circuits are commonly precharged to a high voltage level when a synchronizing clock signal is at one voltage level (e.g., a low voltage level), and selectively discharged to a low voltage level dependent upon the input signals when the clock signal transitions to another voltage level (e.g., a high voltage level).

In general, static logic circuits are less sensitive to noise, clock signal timing, signal race conditions, and semiconductor process variations than dynamic logic structures. Dynamic logic structures, on the other hand, typically operate faster and require less integrated circuit die areas than similar static logic structures. Due to their drawbacks, dynamic logic circuits are often relegated to highly-specialized, hand-tuned circuits, typically those along critical timing paths.

Scan testing is commonly used to test sequential logic circuits of integrated circuits. In typical scan testing approaches, some or all of the storage elements of an integrated circuit are modified to include scan inputs and outputs, and to select the scan inputs in a scan testing mode (i.e., in a scan mode). The scan inputs and outputs of the storage elements are connected together in series to form a shift register (i.e., a scan chain). In the scan mode, the storage elements are used to apply predetermined input signals (i.e., test input signals) to combinational logic (e.g., combinational logic of multiple pipeline stages). During a first shift mode operation, scan data is shifted in to each of the storage elements. The output signals produced by the storage elements are then applied to the combinational logic, and signals produced by the combinational logic are captured by the storage elements. During a second shift mode operation, the captured signals produced by the combinational logic are shifted out of the storage elements of the integrated circuit, and compared to expected values to determine if the combinational logic is performing a desired logic function.

Scan testing is typically performed at clock signal frequencies that are less than normal operating clock signal frequencies. Due to charge leakage at dynamic nodes, (faster) dynamic logic structures often do not operate properly at these lower clock frequencies, necessitating the use of (slower) static logic structures in scan storage elements.

SUMMARY OF THE INVENTION

A latching dynamic logic structure is disclosed including a static logic interface, a dynamic logic gate, and a static latch. The static logic interface receives a data signal, a select signal, and a clock signal, and produces a first intermediate signal such that when the select signal is active, the first intermediate signal is dependent upon the data signal for a period of time following a transition of the clock signal.

The dynamic logic gate receives the first intermediate signal and discharges a dynamic node following the transition of the clock signal dependent upon the first intermediate signal. The static latch receives the clock signal and is coupled to the dynamic node of the dynamic logic gate, and produces an output signal such that the output signal assumes one of two logic levels (e.g., a logic '0' level) following the transition of the clock signal, and assumes the other logic level (e.g., a logic '1' level) in the event the dynamic node is discharged.

A scan-testing-enabled version of the latching dynamic logic structure is described, as is an integrated circuit including the latching dynamic logic structure.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
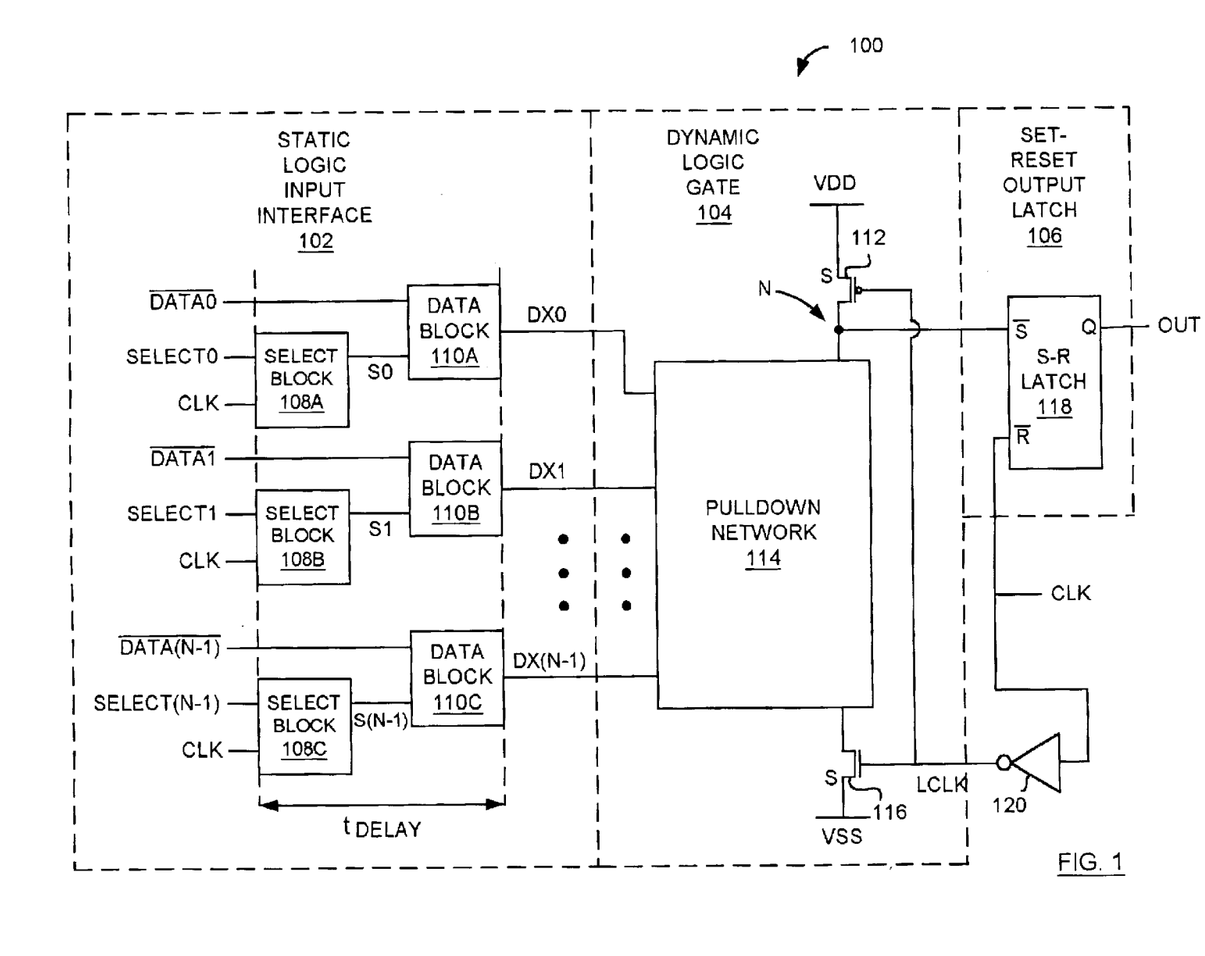
FIG. 1 is a diagram of a generalized version of a latching dynamic logic structure including a static logic input interface, a dynamic logic gate, and a set-reset (S-R) output latch.

FIG. 1 is a diagram of a generalized version of a latching dynamic logic structure 100 including a static logic input interface 102, a dynamic logic gate 104, and a set-reset (S-R) output latch 106. In general, the logic structure 100 performs a logic function and stores a result of the logic function responsive to a clock signal. As indicated in FIG. 1 and described in detail below, the static logic input interface 102 receives static logic input signals, and the set-reset (S-R) output latch 106 produces a static logic output signal OUT of the logic structure 100. The logic structure 100 receives a clock signal CLK, and produces the output signal OUT responsive to the clock signal CLK.

The logic structure 100 may, for example, be part of circuitry partitioned into sequential stages, forming a pipeline. In this situation, the logic structure 100 may be used to implement part or all of a logic function performed in a stage of a pipeline including the logic structure 100, thereby producing an intermediate signal, and to produce the output signal OUT dependent upon the intermediate signal, wherein the output signal OUT is provided to a subsequent stage of the pipeline as an input signal.

More specifically, combinational logic of each stage of the pipeline may be allotted one cycle of the clock signal CLK to perform a corresponding logic function. In this situation, a particular transition of the clock signal CLK (i.e., either a rising edge transition or a falling edge transition of the clock signal) represents a "cycle boundary" of the clock signal CLK. In addition to implementing part or all of the logic function performed in the stage of the pipeline including the logic structure 100, the logic structure 100 may also function as a "cycle boundary latch." That is, in response to the clock boundary transition of the clock signal, the set-reset (S-R) output latch 106 of the logic structure 100 may produce and hold the output signal OUT provided to the subsequent stage of the pipeline.

In the embodiment of FIG. 1, the static logic input interface 102 includes n select blocks, represented using 3 select blocks labeled 108A, 108B, and 108C, and n corresponding data blocks, represented using 3 data blocks labeled 110A, 110B, and 110C. In general, n is greater than or equal to 1. As indicated in FIG. 1, each of the select blocks 108 is coupled in series with the corresponding one of the data blocks 110, forming n series-coupled combinations of the select blocks 108 and the data blocks 110. Each of the n select blocks 108 receives a "SELECTk" signal, where k is between 0 and n−1, and a clock signal CLK, and produces a corresponding "Sk" signal dependent upon the SELECTk signal and the clock signal CLK. The corresponding data block 110 receives an inverted version of a "DATAk" signal, DATAk', and the "Sk" signal, and produces a "DXk" signal dependent upon the DATAk' signal and the Sk signal. As used herein, the "'" symbol after a signal name implies inversion or negation.

In the embodiment of FIG. 1, the DATAk' signals, the SELECTk signals, and the clock signal CLK received by the logic structure 100, and the output signal OUT produced by the logic structure 100, are all static logic signals. Static logic signals are expectedly produced by static logic structures (e.g., static logic gates, registers, and the like). More specifically, static logic signals are expectedly produced at nodes (i.e., static nodes) driven by the static logic structures, wherein the static logic structures form one or more low resistance paths between the static nodes and one of two power supply voltage levels (e.g., $V_{DD}$ and $V_{SS}$) at all times during operation.

Broadly speaking, the SELECTk signal received by a given select block 108 selects or enables (i.e., qualifies) the DATAk' signal received by the corresponding data block 110. More specifically, the select blocks 108 and the corresponding data blocks 110 implement logic functions such that the DXk signals produced by the data blocks 110 are dependent upon the values of the received DATAk' signals when the corresponding SELECTk signals are asserted or active, and are not dependent upon the corresponding DATAk' signals when the corresponding SELECTk signals are deasserted or inactive.

For example, in one embodiment, each of the select blocks 108 implements a NAND logic function such that Sk=(SELECTk·CLK)', and each of the data blocks 110 implements a NOR logic function such that DXk=(Sk+ DATAk')'=(SELECTk·CLK·DATAk). In this situation, when the SELECTk signal is a logic '1' then DXk= (CLK·DATAk), and when the SELECTk signal is a logic '0' then DXk=0.

For example, as indicated in FIG. 1, the select block 108A receives a "SELECT0" signal and the clock signal CLK, and produces an "S0" signal. The corresponding data block 110A receives a corresponding "DATA0" signal and the S0 signal, and produces a "DX0" signal. In general, the SELECT0 signal received by the select block 108A selects or enables (i.e., qualifies) the DATA0' signal received by the corresponding data block 110A. In one embodiment, the select block 108A implements a NAND logic function such that S0=(SELECT0·CLK)', and the data block 110A implements a NOR logic function such that DX0=(S0+DATA0')'= (SELECT0·CLK·DATA0). In this situation, when the SELECT0 signal is a logic '1' then DX0=(CLK·DATA0), and when the SELECT0 signal is a logic '0' then DX0=0.

As indicated in FIG. 1, each series-coupled combination of one of the select blocks 108 and the corresponding one of the data blocks 110 has a propagation delay time "$t_{DELAY}$." As a result, each of the output signals DX0-DX(n-1) produced by the static logic input interface 102 is delayed in time with respect to the clock signal CLK by the time period $t_{DELAY}$. That is, when the clock signal CLK transitions from a high voltage range associated with a logic '1' to a low voltage range associated with a logic '0' (i.e., from high to low), the output signals DX0-DX(n-1) remain the values of the corresponding data signals DATA0'-DATA(n-1)' for the time period $t_{DELAY}$ following the falling edge transition of the clock signal CLK.

After the time period $t_{DELAY}$ following the falling edge transition of the clock signal CLK, the output signals DX0-DX(n-1) are forced to logic '0' (i.e., low). In other words, the output signals DX0-DX(n-1) cease to be dependent upon the corresponding data signals DATA0'-DATA(n-1)' after the time period $t_{DELAY}$ following the falling edge transition of the clock signal CLK. As described in detail below, this action causes the latching dynamic logic structure 100 to act much like an edge-triggered flip-flop.

Similarly, when the clock signal CLK transitions from low to high, the output signals DX0-DX(n-1) remain low for the time period $t_{DELAY}$ following the rising edge of the clock signal CLK. After the time period $t_{DELAY}$ following the rising edge of the clock signal CLK, the output signals DX0-DX(n-1) are dependent upon the corresponding data signals DATA0'-DATA(n-1)'.

As described in more detail below, during the time period $t_{DELAY}$ following the falling edge transition of the clock signal CLK, the DX0-DX(n-1) signals corresponding to selected or enabled data signals DATA0'-DATA(n-1)' signals remain dependent upon the values of the corresponding DATA0'-DATA(n-1)' signals long enough for a dynamic node of the dynamic logic gate 104 to be discharged dependent upon values of the DX0-DX(n-1) signals.

An inverter 120 receives the clock signal CLK and produces a clock signal LCLK that is substantially an inverted version of the clock signal CLK. The dynamic logic gate 104 receives the output signals DX0-DX(n-1) produced by the static logic input interface 102 and the clock signal LCLK. The dynamic logic gate 104 includes a precharge p-channel metal oxide semiconductor (pMOS) transistor 112, a dynamic node N, a pulldown network 114, and an evaluation n-channel metal oxide semiconductor (nMOS) transistor 116. The precharge pMOS transistor 112 precharges the node N when the clock signal LCLK is low (and the clock signal CLK is high).

In general, the pulldown network 114 includes multiple nMOS transistors connected in series and/or parallel such that the dynamic logic gate 104 implements a desired logic function of the received DX0-DX(n-1) signals. When the clock signal LCLK is high (and the clock signal CLK is low), the node N is conditionally discharged through one or more of the nMOS transistors of the pulldown network 114 and the evaluation nMOS transistor 116 dependent upon the received DX0-DX(n-1) signals.

For example, in one embodiment described in more detail below, the dynamic logic gate 104 implements a NOR logic function, and the pulldown network 114 includes multiple nMOS transistors each connected between the node N and the evaluation nMOS transistor 116. Each of the output signals DX0-DX(n-1) received from the static logic input interface 102 is applied to a gate terminal of one of the nMOS transistors of the pulldown network 114. When the clock signal LCLK is high (and the clock signal CLK is low), the node N is conditionally discharged through one or more of the nMOS transistors of the pulldown network 114 and the evaluation nMOS transistor 116.

In the embodiment of FIG. 1, the set-reset (S-R) output latch 106 includes a set-reset (S-R) latch 118. The set-reset (S-R) latch 118 receives a logic signal at the node N of the dynamic logic gate 104 at an active low set (S') input terminal, the clock signal CLK at an active low reset (R') terminal, and produces the output signal OUT at an output (Q) terminal. Also, as will become evident below, in the set-reset (S-R) latch 118, the logic signal at the node N of the dynamic logic gate 104 received at the active low set (S') input terminal has priority over (i.e., overrides or supercedes) the clock signal CLK received at the active low reset (R') terminal.

As described in more detail below, the set-reset (S-R) latch 118 is reset when the clock signal CLK transitions from high to low (i.e., in response to a falling edge transition of the clock signal CLK). When the set-reset (S-R) latch 118 is reset, the output signal OUT is driven low. The set-reset (S-R) latch 118 is then selectively set during the time period $t_{DELAY}$ following the falling edge transition of the clock signal CLK dependent upon the logic signal at the node N of the dynamic logic gate 104. When the set-reset (S-R) latch 118 is set, the output signal OUT is driven high.

After the latching function has occurred (i.e., after the time period $t_{DELAY}$ following the falling edge transition of the clock signal CLK), the output signal OUT of the latching dynamic logic structure 100 of FIG. 1 is defined by the equation OUT=(DATA0·SELECT0)+(DATA1· SELECT1)+ . . . +(DATA(n-1)·SELECT(n-1)).

Figure 2:
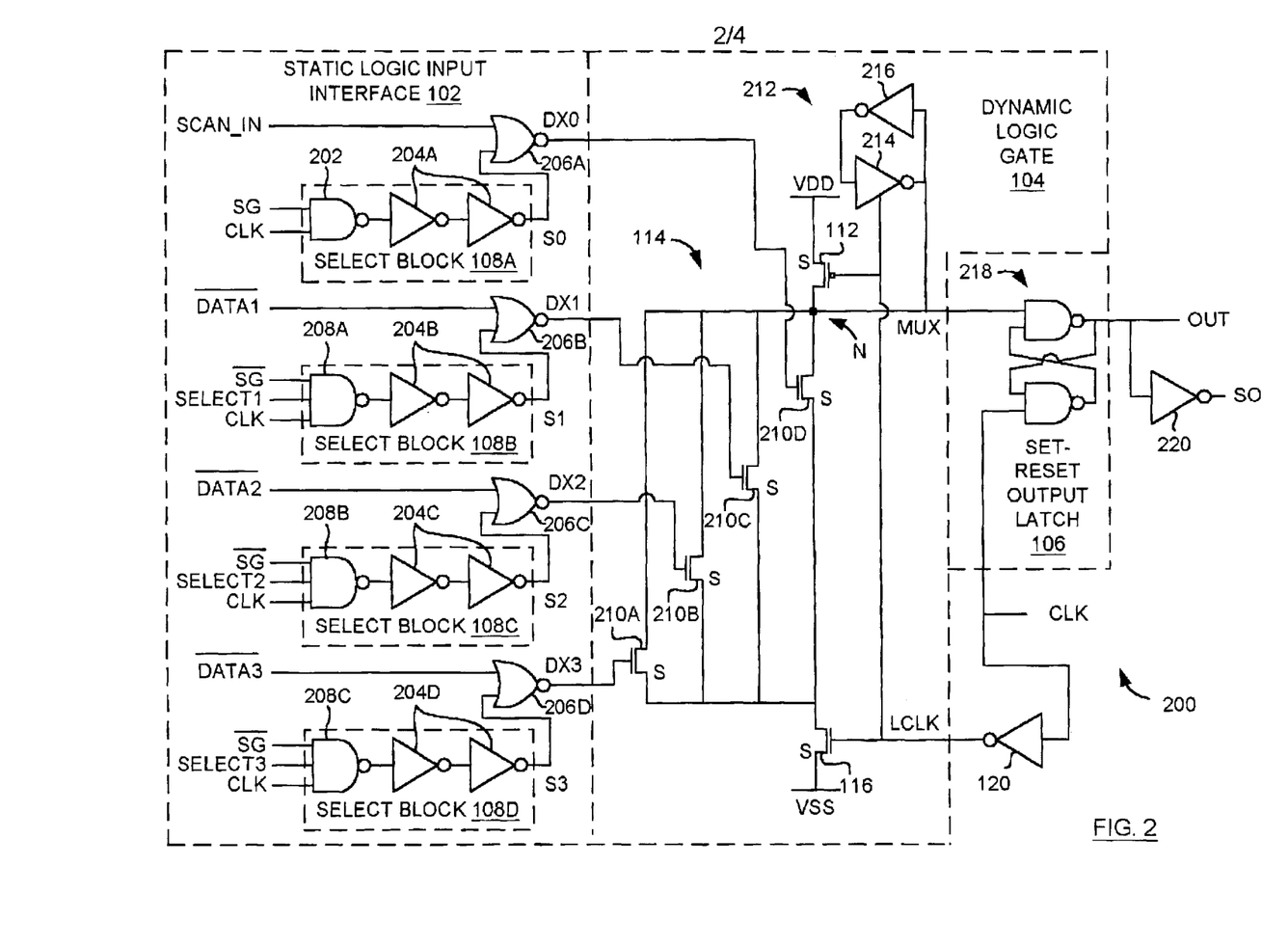
FIG. 2 is a diagram of one embodiment of the logic structure of FIG. 1 wherein the logic structure forms a scan storage element.

FIG. 2 is a diagram of one embodiment of the logic structure 100 of FIG. 1 wherein the logic structure 100 forms a "scan" storage element 200. In general, the scan storage element 200 is capable of being connected in series with other similar scan storage elements to facilitate scan testing. The scan storage element 200 performs a multiplexer logic function in a "functional" operating mode (i.e., in a functional mode), and has a controllable scan input and an observable scan output in a "scan" testing mode (i.e., in a scan mode). The scan storage element 200 may, for example, be used as a cycle boundary latch facilitating scan testing as described in more detail below.

In the embodiment of FIG. 2, the static logic input interface 102 includes 4 select blocks 108 and 4 corresponding data blocks 110 producing 4 static logic signals DX0–DX3. The select block 108A is associated with the scan mode, and a "SCAN_IN" data input of the scan storage element 200 is enabled in the scan mode. The select block 108A receives a static "SCAN GATE" (SG) signal and the clock signal CLK, and produces the intermediate static logic signal S0, where S0=(SG·CLK)'. In general, the SCAN GATE (SG) signal is a logic '1' in the scan mode, and a logic '0' in the functional mode.

In the embodiment of FIG. 2, the select block 108A includes a NAND gate 202 and a pair of inverters 204A all connected in series. The NAND gate 202 receives the SCAN GATE (SG) signal and the clock signal CLK, and performs the NAND logic function of the select block 108A.

The pair of inverters 204A are included in the embodiment of FIG. 2 to increase a signal line driving capability of the NAND gate 202 (i.e., of the select block 108A). In a typical situation, multiple copies of the scan storage element 200 of FIG. 2 are used to handle each of multiple data bits in a similar manner, and the Sk signals produced by the select blocks 108A–108D (k=1, 2, and 3, respectively) are provided to each of the multiple scan storage elements 200. For example, as described below, the scan storage element 200 of FIG. 2 implements a 4-to-1 multiplexer logic function in the typical situation, the data input signals DATA1', DATA2', DATA3', and DATA4' are not single-bit signals, but multiple-bit signals, and multiple copies of the scan storage element 200 may be used to handle each of the bits of the data input signals DATA1', DATA2', DATA3', and DATA4' in a similar manner. As described below, each of the multiple scan storage elements 200 produces a scan out signal "SO" associated with the scan mode. To facilitate scan testing, the scan out signal SO of one of the scan storage elements 200 is expectedly connected to the SCAN_IN data input of another one of the scan storage elements 200. Single select blocks 108A–108D having sufficient signal line driving capabilities can produce the Sk signals and provide the Sk signals to each of the multiple scan storage elements 200.

In the embodiment of FIG. 2, a NOR gate 206A is also associated with the scan mode, and functions as the data block 110A of FIG. 1. The NOR gate 206A receives the static SCAN_IN data signal and the S0 signal produced by the select block 108A, and produces the static logic signal DX0, where DX0=(SG·CLK·SCAN_IN'). In general, the scan input SCAN_IN signal conveys valid scan test input data when the SCAN GATE (SG) signal is a logic '1'. It is noted that the DX0 signal is dependent upon the scan input SCAN_IN signal when the SCAN GATE (SG) signal is a logic '1', and the DX0 signal is a logic '0' when the SCAN GATE (SG) signal is a logic '0'.

In FIG. 2, the select blocks 108B–108D and the corresponding NOR gates 206B–206D are associated with the functional mode, and are used to implement the multiplexer logic function in the functional mode. The static logic signals DX1–DX3 are produced by the NOR gates 206B–206D, respectively, wherein the NOR gates 206B–206D function as 3 of the n data blocks 110 of FIG 1.

Each of the select blocks 108B–108D in FIG. 2 receives a static SELECTk signal (k=1, 2, and 3, respectively), an inverted version of the SCAN GATE signal (SG'), and the clock signal CLK, and produces an intermediate static logic signal Sk, where Sk=(SG'·SELECTk·CLK)'.

In the embodiment of FIG. 2, the select block 108B includes a NAND gate 208A and a pair of inverters 204B all connected in series, the select block 108C includes a NAND gate 208B and a pair of inverters 204C all connected in series, and select block 108D includes a NAND gate 208C and a pair of inverters 204D all connected in series. Each of the NAND gates 208A–208C receives the SELECTk signal (k=1, 2, and 3, respectively), the inverted version of the SCAN GATE signal (SG'), and the clock signal CLK, and performs the NAND logic function of the respective select block 108B–108D. As described above, the pairs of inverters 204B–204D are included in the embodiment of FIG. 2 to increase the signal line driving capabilities of the respective NAND gates 208A–208C in the typical situation where each of the corresponding "DATAk" signals is one bit of a multiple-bit data signal, and the Sk signals produced by the select blocks 108B–108D are provided to multiple logic structures 100.

In the embodiment of FIG. 2, each of the NOR gates 206B–206D receives a static DATAk' data signal (k=1, 2, and 3, respectively) and the Sk signal produced by the corresponding one of the select blocks 108B–108D, and produces the static logic signal DXk, where DXk=(SG'·SELECTk·CLK·DATAk). In general, the DATAk' signal conveys valid data when the SCAN GATE (SG) signal is a logic '0'. It is noted that each of the DXk signals is dependent upon the DATAk' signal when the SG' signal is a logic '1' (i.e., when the SCAN GATE signal SG is a logic '0'), and each of the DXk signals is a logic '0' when the SG' signal is a logic '0' (i.e., when the SCAN GATE signal SG is a logic '1').

Each of the output signals DX0–DX3 produced by the static logic input interface 102 is applied to a corresponding one of 4 nMOS transistors 210A–210D of the pulldown network 114 of the dynamic logic gate 104. In the embodiment of FIG. 2, each of the nMOS transistors 210A–210D is connected between the node N and the evaluation nMOS transistor 116. As described above, the precharge pMOS transistor 112 precharges the node N when the clock signal LCLK is low (and the clock signal CLK is high), and the node N is conditionally discharged through one or more of the nMOS transistors 210A–210D of the pulldown network 114 and the evaluation nMOS transistor 116 when the clock signal LCLK is high (and the clock signal CLK is low) dependent upon the received DX0–DX3 signals.

In the embodiment of FIG. 2, the dynamic logic gate 104 includes a static keeper latch 212 including a cross-coupled pair of inverters 214 and 216. The inverter 214 drives the node N and is a tri-state inverter. The tri-state inverter 214 is disabled when the clock signal LCLK is low (i.e., during precharge), and enabled when the clock signal LCLK is high (i.e., during evaluation).

More specifically, in the embodiment of FIG. 2, the tri-state inverter 214 includes a pMOS transistor coupled between $V_{DD}$ and an output terminal, and two nMOS transistors coupled in series between the output terminal and $V_{SS}$. The pMOS transistor may have a relatively high electrical resistance when enabled (i.e., may be "weak").

The pMOS transistor and one of the nMOS transistors receive an output of the inverter 216 at gate terminals. The other nMOS transistor receives the clock signal LCLK at a gate terminal.

As described above, when the clock signal LCLK is low, the pMOS transistor 112 electrically couples the node N to $V_{DD}$. The pMOS transistor of the tri-state inverter 214 is not gated by the clock signal LCLK, and electrically couples the node N to $V_{DD}$ when the logic signal at the node N is high. This action keeps the node N from "floating" when the DX0–DX3 signals are all low when the clock signal LCLK transitions from low to high. The two nMOS transistors of the tri-state inverter 214 electrically couple the node N to $V_{SS}$ when the logic signal at the node N is low and the clock signal LCLK is high. This action keeps the node N from "floating" during the evaluation phase of the clock signal LCLK and after the time period $t_{DELAY}$ following the falling edge transition of the clock signal CLK when the DX0–DX3 signals are forced low. The tri-state inverter 214 having the nMOS transistor receiving the clock signal LCLK at the gate terminal allows the precharge pMOS transistor 112 to be smaller than would otherwise be necessary.

In the embodiment of FIG. 2, the set-reset (S-R) output latch 106 includes a cross-coupled pair of NAND gates 218 forming a set-reset (S-R) latch. One of the NAND gates receives a MUX signal produced at the node N of the dynamic logic gate 104 at an input terminal, and produces the output signal OUT at an output terminal. The other NAND gate of the cross-coupled pair of NAND gates 218 receives the clock signal CLK at an input terminal.

As described in more detail below, the set-reset (S-R) latch formed by the cross-coupled pair of NAND gates 218 is reset when the clock signal CLK transitions from a logic '1' to a logic '0' (i.e., from high to low). When the set-reset (S-R) latch formed by the cross-coupled pair of NAND gates 218 is reset, the output signal OUT is driven low. The set-reset (S-R) latch formed by the cross-coupled pair of NAND gates 218 is selectively set during the time period $t_{DELAY}$ following the falling edge transition of the clock signal CLK dependent upon the MUX signal. When the set-reset (S-R) latch formed by the cross-coupled pair of NAND gates 218 is set, the output signal OUT is driven high.

As indicated in FIG. 2, an inverter 220 receives the output signal OUT and produces the scan out signal SO that is substantially an inverted version of the output signal OUT. The inverter 220 provides a signal buffering function that decouples an electrical load of the scan out signal SO from an electrical load of the output signal OUT.

After the latching function has occurred (i.e., after the time period $t_{DELAY}$ following the falling edge transition of the clock signal CLK), the output signal OUT of the scan storage element 200 of FIG. 2 is defined by the equation OUT=(SCAN_IN'·SG)+(DATA1·SELECT1·SG')+ (DATA2·SELECT2·SG')+(DATA3·SELECT3·SG').

Figure 3:
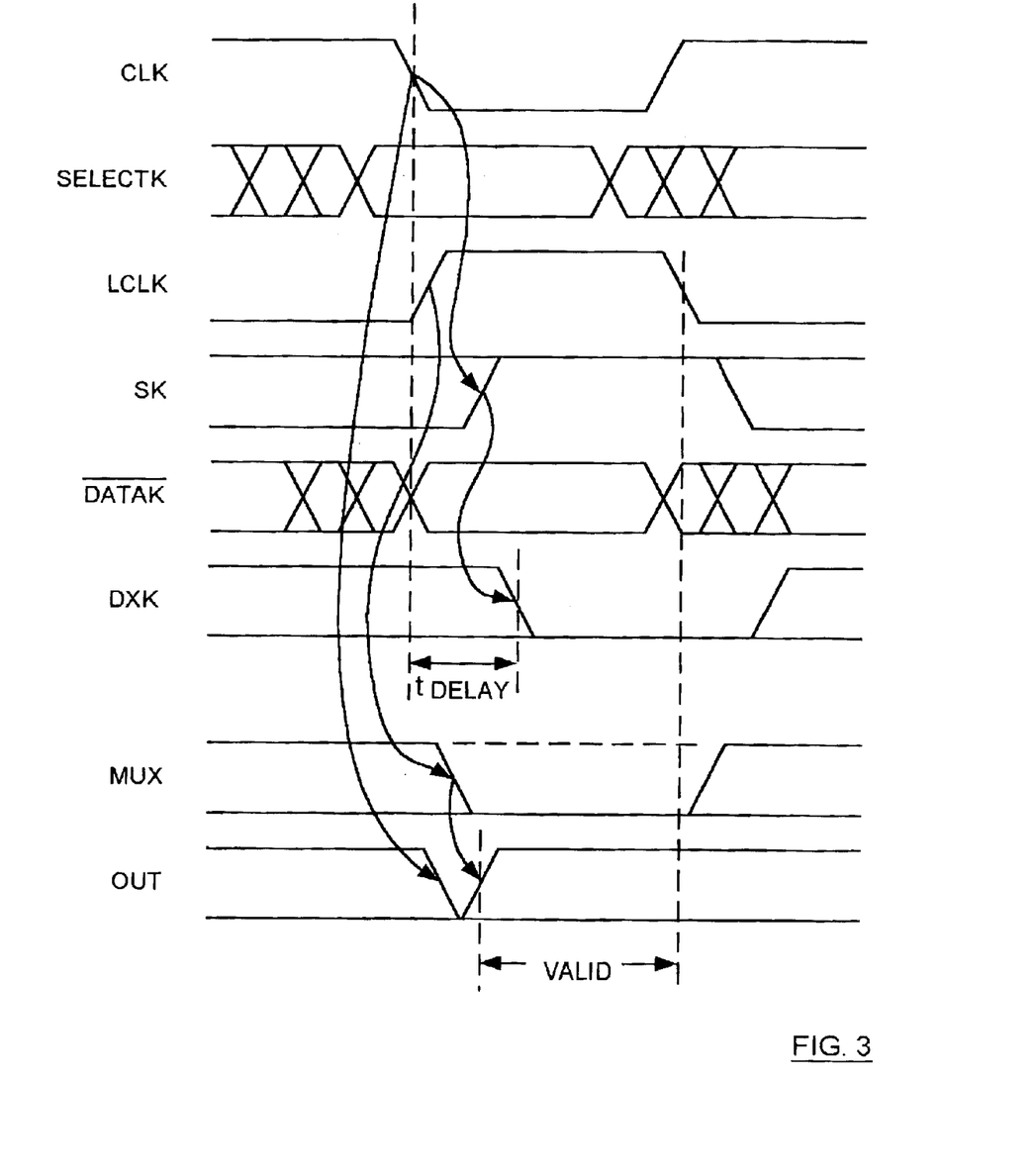
FIG. 3 is a timing diagram depicting voltage levels of signals within the scan storage element of FIG. 2 versus time when the scan storage element is operating in a functional mode.

FIG. 3 is a timing diagram depicting voltage levels of signals within the scan storage element 200 of FIG. 2 versus time when the scan storage element 200 is operating in the functional mode. When the scan storage element 200 is operating in the functional mode, the SCAN GATE (SG) signal is a logic '0', the SG' signal is a logic '1', and the DX0 signal produced by the static logic input interface 102 is a logic 0.

As indicated in FIG. 3, when the clock signal CLK transitions from high to low, the OUT signal is driven low (i.e., the set-reset (S-R) output latch 106 is reset). There is a short time delay after the clock signal CLK transitions from high to low, the clock signal LCLK transitions from low to high, and enters the evaluation phase. During the time period $t_{DELAY}$ following the falling edge transition of the clock signal CLK, each of the DXk signals (k=1 to 3) remains valid long enough for the node N to be discharged dependent upon the values of the DXk signals. Following the time period $t_{DELAY}$ after the falling edge transition of the clock signal CLK, each of the DXk signals assumes a value that does not result in the discharging of the node N (e.g., a logic '0' as indicated in FIG. 3).

For example, assume the SELECT1 and SELECT2 signals are low, and the SELECT3 signal is high prior to a falling edge transition of the clock signal CLK. If the DATA3' signal is low, the DX3 signal is high during the time period $t_{DELAY}$ following the falling edge transition of the clock signal CLK, the node N is discharged, the MUX signal at node N transitions from high to low as indicated in FIG. 3, and the low MUX signal causes the OUT signal to transition from low to high. If, on the other hand, the DATA3' signal is high, the DX3 signal is low during the time period $t_{DELAY}$ following the falling edge transition of the clock signal CLK, the node N is not discharged, the MUX signal at node N stays high, and the OUT signal stays low.

As indicated in FIG. 3, the OUT signal is valid when the LCLK signal is high (i.e., during the evaluation phase) following a sufficient amount of time for the node N to be discharged dependent upon the DX0–DX3 signals (i.e., the MUX signal at node N to transition from high to low) and the output signal OUT to transition from low to high.

Figure 4:
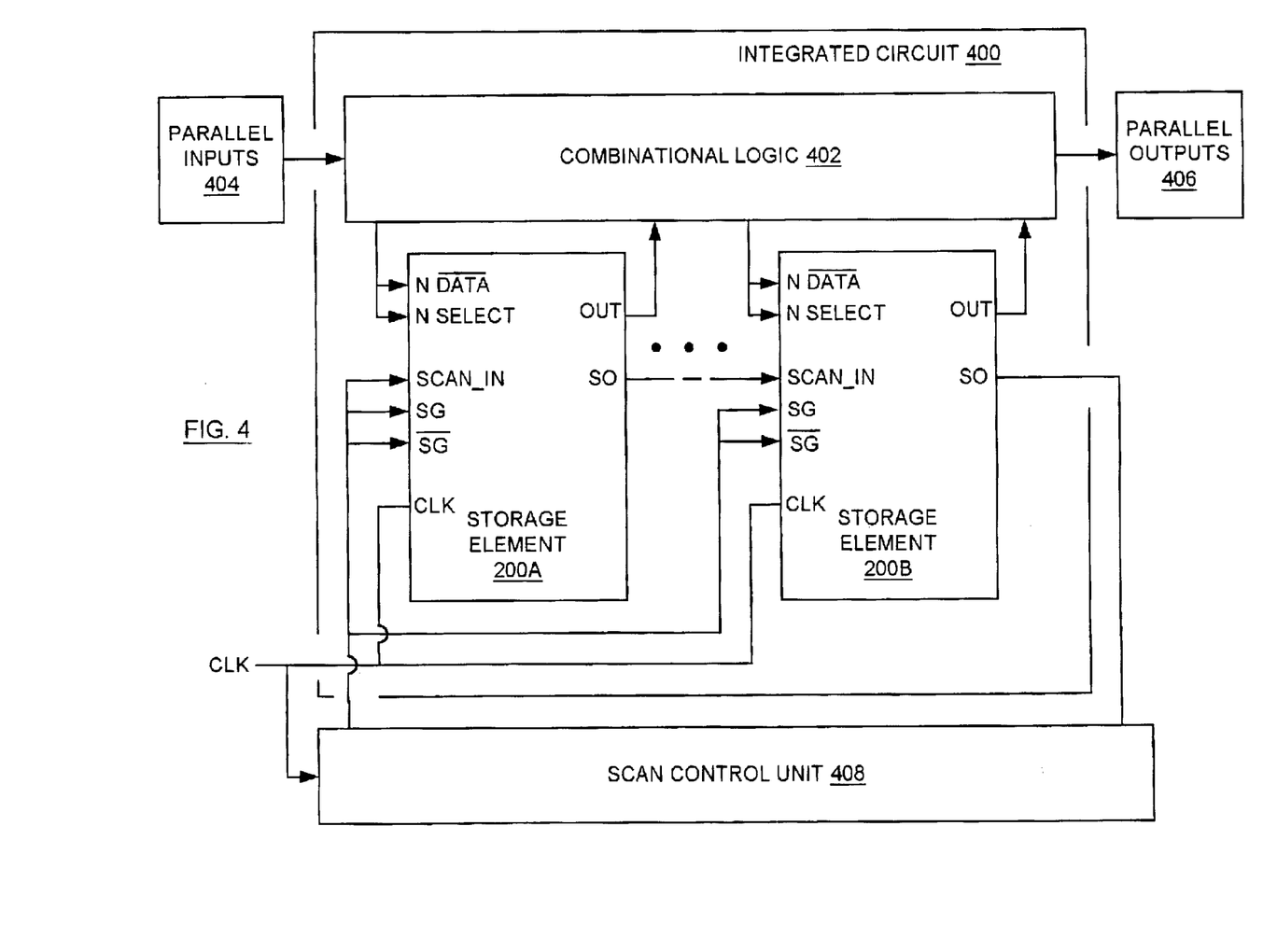
FIG. 4 is a diagram of one embodiment of an integrated circuit including combinational logic and multiple copies of the scan storage element of FIG. 2.

FIG. 4 is a diagram of one embodiment of an integrated circuit 400 including combinational logic 402 and multiple copies of the scan storage element 200 of FIG. 2, labeled scan storage elements 200A and 200B in FIG. 4. Herein below, the scan storage elements 200A and 200B will be referred to collectively as the scan storage elements 200.

The integrated circuit 400 normally operates in a functional mode, during which the scan storage elements 200 are used to save values of signals present within the combinational logic 402 (i.e., a "state" of the combinational logic 402) responsive to the clock signal CLK. The combinational logic 402 receives parallel input signals 404, and the output signals OUT produced by the scan storage elements 200, and produces DATA' and SELECT signals received by the scan storage elements 200, and parallel output signals 406. In the embodiment of FIG. 4, each of the scan storage elements 200 receives n DATA' signals and n SELECT signals from the combinational logic 402, uses the received n DATA' and n SELECT signals to produce and latch the output signal OUT in response to the clock signal CLK as described above, and provides the output signal OUT to the combinational logic 402. It is noted that in other embodiments each of the scan storage elements 200 may receive a different number of DATA' and SELECT signals from the combinational logic 402.

As indicated in FIG. 4, the scan control unit 408 is coupled to the integrated circuit 400. Signals from the scan control unit 408 cause the integrated circuit 400 to transition from the functional mode to a scan mode. As indicated in FIG. 4, a scan out SO terminal of one of the scan storage elements 200 is connected to the scan input SCAN_IN terminal of another one of the scan storage elements 200 such that the scan storage elements 200 form a shift register (i.e., a scan chain). In the scan mode, the scan storage elements 200 are used to apply predetermined input signals (i.e., test input signals) to the combinational logic 402. Each of the scan storage elements 200 in the scan chain receives the SCAN GATE (SG) signal and the SG' signal from the scan control unit 408. In FIG. 4, the scan storage element 200A is the first scan storage element in the scan chain, and receives the scan input SCAN_IN signal from the scan control unit 408. The scan storage element 200B is the last scan storage element in the scan chain, and provides the scan out signal SO to the scan control unit 408.

During a shift mode operation, the scan control unit 408 produces a high SCAN GATE (SG) signal and a low SG' signal. In response to the high SCAN GATE (SG) signal and the low SG' signal, each of the scan storage elements 200 selects the scan input SCAN_IN signal instead of one or more of the normal n DATA' signals. The scan control unit 408 provides the test input signals to the scan storage element 200A as the scan input SCAN_IN signal in sequence as the clock signal CLK is cycled such that the test input signals are propagated through the scan chain.

The last cycle of the clock signal CLK during the shift mode operation is known as the "launch clock." After the launch clock, the output signals OUT produced by the scan storage elements 200 in the scan chain are the test input signals.

The scan control unit 408 then transitions the SCAN GATE (SG) signal from high to low and the SG' signal from low to high. In response to the low SCAN GATE (SG) signal and the high SG' signal, each of the scan storage elements 200 selects the normal data input DATA' signals instead of the scan input SCAN_IN signal. The clock signal CLK is then cycled once following the launch clock. This cycle of the clock signal CLK immediately following the launch clock is referred to as the "capture clock." During the capture clock, the DATA' signals produced by the combinational logic 402 are captured by the scan storage elements 200.

During a subsequent shift mode operation, the scan control unit 408 produces a high SCAN GATE (SG) signal and a low SG' signal. In response to the high SCAN GATE (SG) signal and the low SG' signal, each of the scan storage elements 200 selects the scan input SCAN_IN signal instead of one or more of the normal n DATA' signals. As the clock signal CLK is cycled, the scan control unit 408 receives the captured signals produced by the combinational logic 402 from the scan storage element 200B in sequence. While receiving the captured signals produced by the combinational logic 402, the scan control unit 408 may also be providing other test input signals to the scan storage element 200A as the scan input SCAN_IN signal in sequence such that the other test input signals are "scanned in" as the captured signals are "scanned out."

Once retrieved from the integrated circuit 400, the captured signals produced by the combinational logic 402 in response to the test input signals may be compared to expected values to determine if the combinational logic 402 is performing a desired logic function.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A latching dynamic logic structure, comprising:
   a static logic interface coupled to receive a data signal, a select signal, and a clock signal, and configured to produce a first intermediate signal such that in the event the select signal is active, the first intermediate signal is dependent upon the data signal for a period of time following a transition of the clock signal;
   a dynamic logic gate coupled to receive the first intermediate signal and configured to discharge a dynamic node following the transition of the clock signal dependent upon the first intermediate signal; and
   a static latch coupled to receive the clock signal and to the dynamic node of the dynamic logic gate, and configured to produce an output signal such that the output signal assumes one of two logic levels following the transition of the clock signal, and assumes the other logic level in the event the dynamic node is discharged.

2. The latching dynamic logic structure as recited in claim 1, wherein in the event the select signal is active, the first intermediate signal ceases to be dependent upon the data signal after the period of time following the transition of the clock signal.

3. The latching dynamic logic structure as recited in claim 1, wherein the static logic interface comprises logic coupled to receive the data signal, the select signal, and the clock signal, and configured to produce the first intermediate signal such that in the event the select signal is active, the first intermediate signal is dependent upon the data signal for a period of time substantially equal to a propagation delay time of the logic following the transition of the clock signal.

4. The latching dynamic logic structure as recited in claim 1, wherein the static logic interface comprises a select block and a data block coupled in series, and wherein the select block is coupled to receive the select signal and the clock signal and configured to produce a second intermediate signal, and wherein the data block is coupled to receive the data signal and the second intermediate signal and to produce the first intermediate signal.

5. The latching dynamic logic structure as recited in claim 4, wherein in the event the select signal is active, the first intermediate signal is dependent upon the data signal prior to the transition of the clock signal, and remains dependent upon the data signal for a period of time substantially equal to a combined propagation delay time of the select block and the data block the following the transition of the clock signal.

6. The latching dynamic logic structure as recited in claim 4, wherein the select block performs a NAND logic function upon the select signal and the clock signal in order to produce the second intermediate signal.

7. The latching dynamic logic structure as recited in claim 4, wherein the data block performs a NOR logic function upon the second intermediate signal and the data signal in order to produce the first intermediate signal.

8. The latching dynamic logic structure as recited in claim 1, wherein the dynamic logic gate is configured to charge the dynamic node prior to the transition of the clock signal.

9. The latching dynamic logic structure as recited in claim 8, wherein the dynamic logic gate comprises a precharge device for charging the dynamic node prior to the transition of the clock signal, and a pulldown network and an evaluation device coupled in series for discharging the dynamic node following the transition of the clock signal dependent upon the first intermediate signal.

10. The latching dynamic logic structure as recited in claim 1, wherein the static latch comprises a set-reset latch having a set input terminal, a reset input terminal, and an output terminal.

11. The latching dynamic logic structure as recited in claim 10, wherein the set terminal of the set-reset latch is coupled to the dynamic node of the dynamic logic gate, and wherein the reset terminal of the set-reset latch is coupled to receive the clock signal.

12. The latching dynamic logic structure as recited in claim 10, wherein the set-reset latch comprises a pair of cross-coupled NAND gates.

13. A latching dynamic logic structure, comprising:
   a static logic interface comprising n logic blocks, wherein n≧1, and wherein each of the n logic blocks is coupled to receive one of n data signals, a corresponding one of n select signals, and a clock signal, and configured to produce one of n first intermediate signals such that in the event the received one of n select signals is active, the produced one of n first intermediate signals is dependent upon the received one of n data signals for a period of time following a transition of the clock signal;
   a dynamic logic gate coupled to receive the n first intermediate signals and configured to discharge a dynamic node following the transition of the clock signal dependent upon the n first intermediate signals; and
   a static latch coupled to receive the clock signal and to the dynamic node of the dynamic logic gate, and configured to produce an output signal such that the output signal assumes one of two logic levels following the transition of the clock signal, and assumes the other logic level in the event the dynamic node is discharged.

14. The latching dynamic logic structure as recited in claim 13, wherein each of the n logic blocks comprises a select block and a data block coupled in series, and wherein the select block is coupled to receive the one of n select signals and the clock signal and configured to produce one of n second intermediate signals, and wherein the data block is coupled to receive the one of n data signals and the one of n second intermediate signals and configured to produce the one of n first intermediate signals.

15. The latching dynamic logic structure as recited in claim 14, wherein in the event any one of the n select signals is active, a corresponding one of the n first intermediate signals is dependent upon a corresponding one of the n data signals for a period of time substantially equal to a combined propagation delay time of the select block receiving the active one of the n select signals and the data block producing the corresponding one of the n first intermediate signals following the transition of the clock signal.

16. The latching dynamic logic structure as recited in claim 13, wherein each of the n select blocks performs a NAND logic function upon the received one of n select signals and the clock signal in order to produce the one of n second intermediate signals.

17. The latching dynamic logic structure as recited in claim 13, wherein each of the n data blocks performs a NOR logic function upon the received one of n second intermediate signals and the received one of n data signals in order to produce the one of n first intermediate signals.

18. The latching dynamic logic structure as recited in claim 13, wherein one of the n logic blocks comprises a scan block, and the one of n data signals received by the scan block comprises scan data, and the one of n select signals received by the scan block comprises a scan enable signal.

19. The latching dynamic logic structure as recited in claim 18, wherein each of the other (n−1) logic blocks is coupled to receive an inverted version of the scan enable signal in addition to the one of n data signals, the corresponding one of n select signals, and the clock signal, and is configured to produce the one of n first intermediate signals such that in the event the scan enable signal is active, the produced one of n first intermediate signals assumes a logic value that does not result in the discharging the dynamic node of the dynamic logic gate following the transition of the clock signal.

20. An integrated circuit, comprising:
   combinational logic; and
   a plurality of latching dynamic logic structures coupled to the combinational logic, each comprising:
      a static logic interface coupled to receive a data signal and a select signal from the combinational logic, and a clock signal, and configured to produce a first intermediate signal such that in the event the select signal is active, the first intermediate signal is dependent upon the data signal for a period of time following a transition of the clock signal;
      a dynamic logic gate coupled to receive the first intermediate signal and configured to discharge a dynamic node following the transition of the clock signal dependent upon the first intermediate signal; and
      a static latch coupled to receive the clock signal and to the dynamic node of the dynamic logic gate, and configured to produce an output signal and to provide the output signal to the combinational logic, wherein the output signal assumes one of two logic levels following the transition of the clock signal, and assumes the other logic level in the event the dynamic node is discharged.

* * * * *